(12) United States Patent
Hung et al.

(10) Patent No.: US 8,759,121 B2
(45) Date of Patent: *Jun. 24, 2014

(54) LIGHT EMITTING DIODE ARRAY AND METHOD FOR MANUFACTURING THE SAME

(75) Inventors: Tzu-Chien Hung, Hsinchu (TW); Chia-Hui Shen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/315,302

(22) Filed: Dec. 9, 2011

(65) Prior Publication Data

US 2012/0292633 A1    Nov. 22, 2012

(30) Foreign Application Priority Data

May 18, 2011    (CN) .......................... 2011 1 0128988

(51) Int. Cl.
*H01L 29/72*    (2006.01)

(52) U.S. Cl.
USPC ................... 438/22; 438/27; 438/29; 438/39; 438/738; 438/745

(58) Field of Classification Search
USPC .......................... 438/22, 27, 29, 39, 738, 745
See application file for complete search history.

(56) References Cited

U.S. PATENT DOCUMENTS

| | | | |
|---|---|---|---|
| 5,972,730 A * | 10/1999 | Saito et al. | 438/39 |
| 7,186,580 B2 * | 3/2007 | Tran et al. | 438/22 |
| 8,415,179 B2 * | 4/2013 | Hung et al. | 438/22 |
| 2010/0317132 A1 * | 12/2010 | Rogers et al. | 438/27 |

* cited by examiner

*Primary Examiner* — Edward Wojciechowicz
(74) *Attorney, Agent, or Firm* — Novak Druce Connolly Bove + Quigg LLP

(57) ABSTRACT

An LED array includes a substrate and a plurality of LEDs formed on the substrate. The LEDs are electrically connected with each other. Each of the LEDs includes a connecting layer, an n-type GaN layer, an active layer, and a p-type GaN layer formed on the substrate in sequence. The connecting layer is etchable by alkaline solution. A bottom surface of the n-type GaN layer which connects the connecting layer has a roughened exposed portion. The bottom surface of the n-type GaN layer has an N-face polarity. A method for manufacturing the LED array is also provided.

5 Claims, 8 Drawing Sheets

LIGHT EMITTING DIODE ARRAY AND METHOD FOR MANUFACTURING THE SAME

BACKGROUND

1. Technical Field

The present disclosure relates to semiconductor devices and, particularly, to a light emitting diode array and a method for manufacturing the light emitting diode array.

2. Description of Related Art

Light emitting diodes (LEDs) have many beneficial characteristics, including low electrical power consumption, low heat generation, long lifetime, small volume, good impact resistance, fast response and excellent stability. These characteristics have enabled the LEDs to be used as a light source in electrical appliances and electronic devices.

In general, the light output of an LED depends on the quantum efficiency of the active layer and the light extraction efficiency. As the light extraction efficiency increases, the light output of the LED is enhanced. In order to improve the light extraction efficiency, efforts are made to overcome the significant photon loss resulting from total reflection inside the LED after emission from the active layer.

There are several methods for increasing the light extraction efficiency of the LED. A typical method for increasing the light extraction efficiency of the LED is to roughen the surface of the LED by etching. However, it is difficult to roughen the surface of the conventional LED, and the etching process is usually time-consuming.

What is needed is an LED array and a method for manufacturing the LED array which can ameliorate the problem of the prior art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
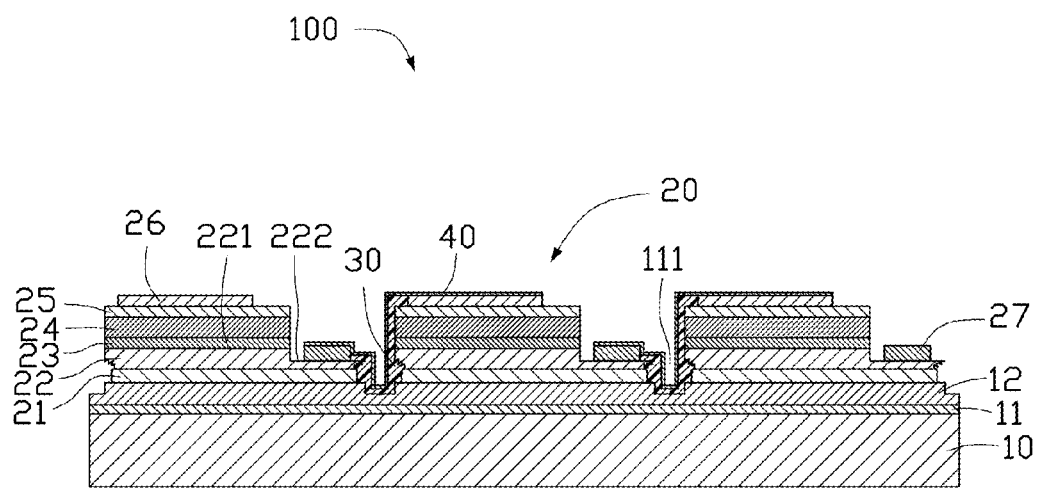
FIG. 1 is a cross section of an LED array according to an exemplary embodiment of the present disclosure.

Referring to FIG. 1, an LED array 100 according to an exemplary embodiment is shown. The LED array 100 includes a substrate 10, a plurality of LEDs 20 formed on a top side of the substrate 10, insulating layers 30 positioned between each two adjacent LEDs 20, and wires 40 electrically connecting the LEDs 20.

In this embodiment, the LED array 100 includes three LEDs 20. However, a number of the LEDs 20 is not limited to three; it can be two or more. Each of the LEDs 20 includes a connecting layer 21, an n-type GaN layer 22, an active layer 23, a p-type GaN layer 24, a transparent conductive layer 25, a p-type electrode 26 and an n-type electrode 27. The connecting layer 21, the n-type GaN layer 22, the active layer 23, the p-type GaN layer 24 and the transparent conductive layer 25 are formed on the substrate 10 in sequence.

The connecting layer 21 can be etched easily by alkaline solution under 100 degrees centigrade. The area of the connecting layer 21 is smaller than that of the n-type GaN layer 22. Thus, a bottom surface of the n-type GaN layer 22, which is adjacent to the connecting layer 21, has its edge portion exposed. The connecting layer 21 can be made of a material selected from a group consisting of AlN, $SiO_2$, and silicon nitride. In the present embodiment, the connecting layer 21 is made of AlN. Preferably, a thickness of the connecting layer 21 is in a range of 5 nm to 1000 nm. When the thickness of the connecting layer 21 is greater than 5 nm, an etching solution can easily penetrate into the connecting layer 21. However, if the thickness of the connecting layer 21 is greater than 1000 nm, a semiconductor structure formed on the connecting layer 21 will crack due to a great stress between the semiconductor structure and the connecting layer 21. An electrical resistance of the connecting layer 21 is much greater than an electrical resistance of the LED 20. For example, the resistance of the connecting layer 21 formed of AlN is about 2000 ohms, and the resistance of the LED 20 is just about 10 ohms to 20 ohms.

Figure 2:
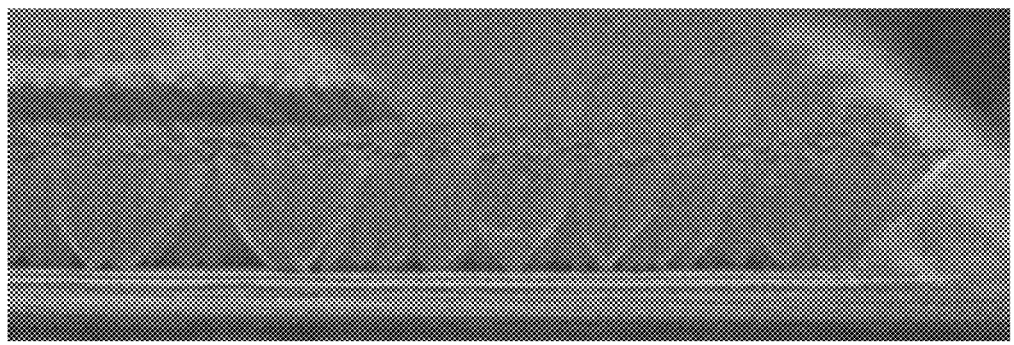
FIG. 2 is a photo of an N-face GaN etched by alkaline solution.

A bottom surface of the n-type GaN layer 22 has an N-face polarity. The so called GaN layer with Ga-face polarity has its Ga atoms arranged on top lattice plane thereof. The GaN layer with N-face polarity has its N atoms arranged on top lattice plane thereof. The GaN layer with N-face polarity can be etched by alkaline solution under 100 degrees centigrade to form a roughened surface with hexagonal pyramid features (see FIG. 2). On the contrary, the Ga-face GaN does not react with alkaline solution under 100 degrees centigrade.

The exposed portion of the bottom surface of the n-type GaN layer 22 is roughened to improve the light extraction efficiency of the LED 100. The n-type GaN layer 22 has a top surface away from the connecting layer 21, wherein the top surface includes a first area 221 and a second area 222. The active layer 23, the p-type GaN layer 24, the transparent conductive layer 25, and the p-type electrode 26 are formed on the first area 221 in sequence. The n-type electrode 27 is formed on the second area 222.

The transparent conductive layer 25 can be made of Ni—Au alloy or indium tin oxide (ITO). In the present embodiment, the transparent conductive layer 70 is made of ITO.

The substrate 10 is made of a material selected from a group consisting of Si, SiC and sapphire. In order to improve the quality of the semiconductor layers, a buffer layer 11 and a GaN layer 12 can be formed on the substrate 10 before forming the connecting layer 21. Preferably, the GaN layer 12 is an n-type GaN layer and a surface of the GaN layer 12 away from the substrate 10 has a Ga-face polarity.

Grooves 111 are formed between the LEDs 20 to separate the LEDs 20 from each other. The insulating layer 30 is formed inside the grooves 111 between the LEDs 20 for protecting the LEDs 20 and avoiding short-circuit failure between the LEDs 20 due to the wires 40 formed in following steps. In alternative embodiments, the insulating layer 30 can cover top surfaces of the LEDs 20 excepting the electrodes 26, 27.

The wires 40 are formed on the insulating layer 30, and the LEDs 20 are connected in parallel or series with each other by the wires 40. In this embodiment, the LEDs 20 are connected in series by the wires 40. That is, each of the wires 40 has one end connected to a p-type electrode 26 of an LED 20, and the other end connected to an n-type electrode 27 of an adjacent LED 20. In alternative embodiments, the LEDs 20 can be electrically connected together by wire bonding.

A method for manufacturing the LED array 100 according to the exemplary embodiment is described as follows.

Figure 3:
FIGS. 3-8 are views showing steps of an embodiment of a method for manufacturing the LED array of FIG. 1.

Referring to FIG. 3, firstly, a substrate 10 is provided. The substrate 10 can be made of a material selected from a group consisting of Si, SiC, and sapphire, etc.

Figure 4:
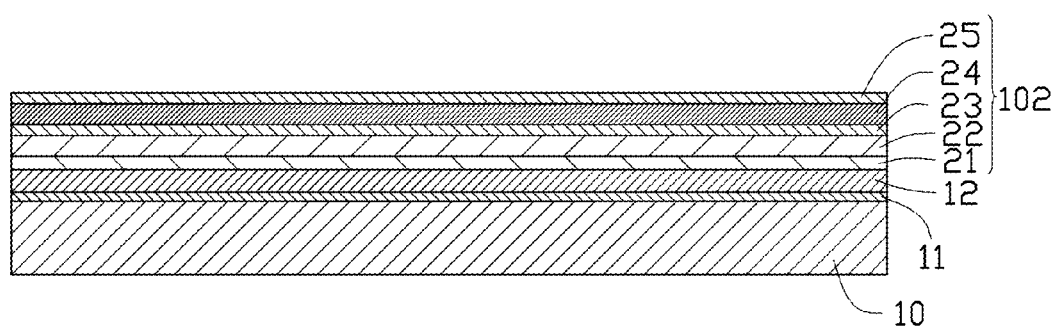

Referring to FIG. 4, a connecting layer 21, an n-type GaN layer 22, an active layer 23, a p-type GaN layer 24 and a transparent conductive layer 25 are formed on the substrate 10 in sequence. The connecting layer 21, the n-type GaN layer 22, the active layer 23, the p-type GaN layer 24 and the transparent conductive layer 25 corporately form a semiconductor structure 102. In this embodiment, before forming the connecting layer 21, a buffer layer 11 and a GaN layer 12 are formed on the substrate 10 to improve the quality of connection of the semiconductor layer 102 on the substrate 10. A surface of the GaN layer 12 away from the substrate 10 has a Ga-face polarity to avoid being etched by alkaline solution. A thickness of the connecting layer 21 ranges from 5 nm to 1000 nm. A bottom surface of the n-type GaN layer 22 has an N-face polarity which can be etched easily by alkaline solution.

Figure 5:
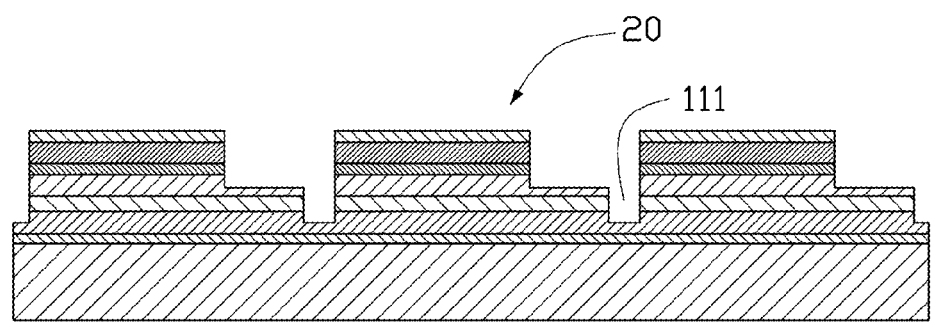

Referring FIG. 5, a plurality of grooves 111 are formed in the semiconductor structure 102 and divide the semiconductor structure 102 into a plurality of LEDs 20. The grooves 111 at least extend through the transparent conductive layer 25, the p-type GaN layer 24, the active layer 23 and the n-type GaN layer 22 to expose the connecting layer 21. Therefore the connecting layer 21 can be easily etched by alkaline solution. The groove 111 can be formed by inductively coupled plasma (ICP) technology. Preferably, the grooves 111 can further pass through the connecting layer 21 to expose the GaN layer 12 as shown by FIG. 5.

The transparent conductive layer 25, the p-type GaN layer 24 and the active layer 23 are etched to expose a portion of the n-type GaN layer 22. Part of the n-type GaN layer 22 is also be etched.

Figure 6:
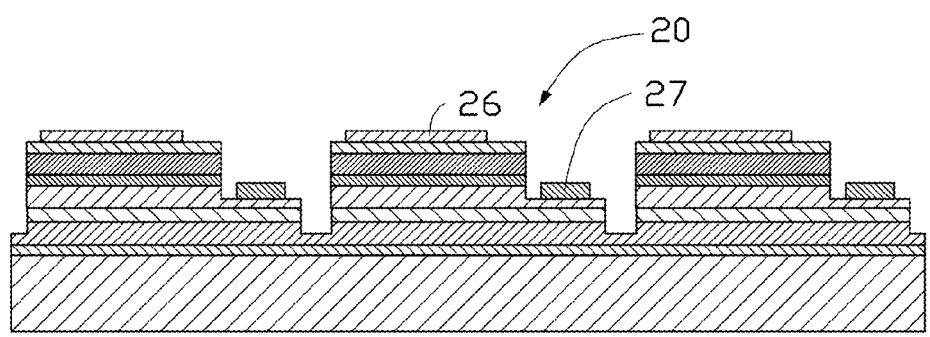

Referring to FIG. 6, a p-type electrode 26 is formed on the transparent conductive layer 25 and an n-type electrode 27 is formed on the exposed portion of the n-type GaN layer 22 of each LED 20.

Figure 7:
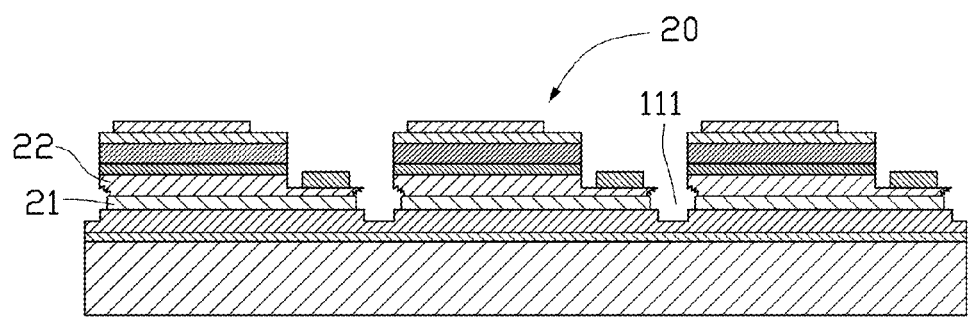

Referring to FIG. 7, the connecting layer 21 of the each LED 20 is etched by alkaline solution to expose portions of a bottom surface of the n-type GaN layer 22. Then the alkaline solution is used to etch and roughen the exposed portions of the bottom surface of the n-type GaN layer 22. In order to accelerate the etching, the alkaline solution can be strong alkaline solution, such as KOH solution, NaOH solution etc. In this embodiment, the connecting layer 21 and the n-type GaN layer 22 can be etched by KOH solution under a temperature of 85 degree centigrade for 30 to 60 minutes.

Figure 8:
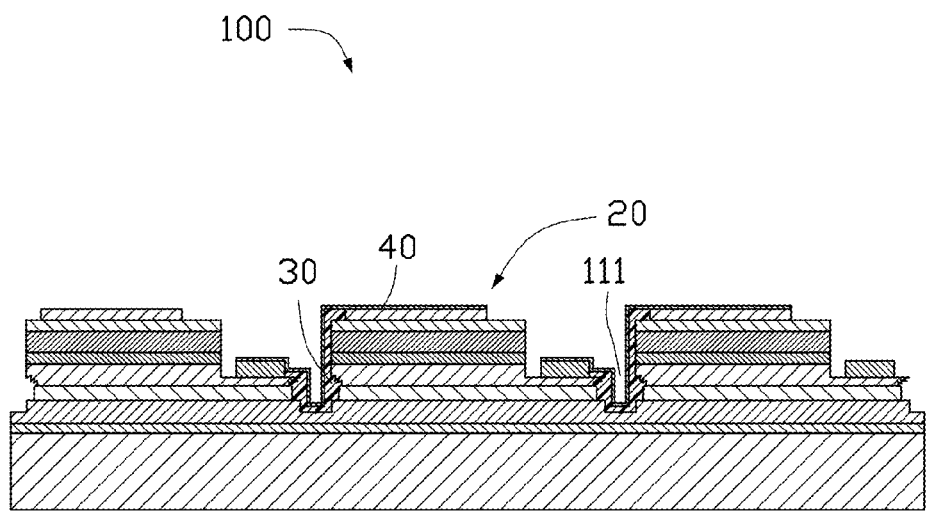

Referring to FIG. 8, insulating layers 30 are formed in the grooves 111. Then wires 40 are formed on the insulating layers 30 to form electrical connections between the LEDs 20.

It is understood that, in other embodiments of the method for fabricating the LED array 100, the p-type electrode 26 can be directly formed on the p-type GaN layer 24, without forming the transparent conductive layer 25 on the p-type GaN layer 24 in advance. Furthermore, the p-type electrode 26 and the n-type electrode 27 can also be formed after roughening of the bottom surface of the n-type GaN layer 22.

In the LED array 100, each of the LEDs 20 includes a connecting layer 21 which can be easily etched by alkaline solution. In addition, the bottom surface of the n-type GaN layer 22 adjacent to the connecting layer 21 has an N-face polarity. Therefore, the bottom surface of the n-type GaN layer 22 can be easily roughened to improve light extracting efficiency of the LED 20.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A method for manufacturing an LED array comprising:
providing a substrate;
forming a connecting layer, an n-type GaN layer, an active layer and a p-type GaN layer on the substrate in sequence, the connecting layer, the n-type GaN layer, the active layer and the p-type GaN layer cooperatively forming a semiconductor structure, a bottom surface of the second n-type GaN layer facing towards and in connection with the connecting layer having an N-face polarity;
forming grooves in the semiconductor structure and dividing the semiconductor structure into a plurality of LEDs, the grooves at least passing through the p-type GaN layer, the active layer and the n-type GaN layer to expose the connecting layer;
etching a part of the connecting layer by alkaline solution to expose a portion of the bottom surface of the n-type GaN layer, and correspondingly roughening the exposed portion of the bottom surface of the n-type GaN layer during the etching; and
forming electrical connections between the LEDs;
wherein the alkaline solution is a strong alkaline solution, and the connecting layer and the n-type GaN layer are etched by the strong alkaline solution under a temperature of 85 degrees centigrade for 30 to 60 minutes.

2. The method as claimed in claim 1, wherein the grooves pass through the connecting layer.

3. The method as claimed in claim 1, wherein the strong alkaline solution is KOH solution or NaOH solution.

4. The method as claimed in claim 1, wherein insulating layers are formed in the grooves before forming electrical connections between the LEDs.

5. The method as claimed in claim 1, wherein the connecting layer is made of a material selected from a group consisting of AlN, $SiO_2$, and silicon nitride.

* * * * *